United States Patent [19]
Wada

[11] Patent Number: 5,998,822
[45] Date of Patent: Dec. 7, 1999

[54] SEMICONDUCTOR INTEGRATED CIRCUIT AND A METHOD OF MANUFACTURING THE SAME

[75] Inventor: Toshio Wada, Tateyama, Japan

[73] Assignee: Nippon Steel Semiconductor Corp., Tateyama, Japan

[21] Appl. No.: 08/978,429

[22] Filed: Nov. 25, 1997

[30] Foreign Application Priority Data

Nov. 28, 1996 [JP] Japan .................................. 8-331402
Jul. 23, 1997 [JP] Japan .................................. 9-211180

[51] Int. Cl.$^6$ ........................ H01L 27/108; H01L 29/76; H01L 29/94; H01L 31/119
[52] U.S. Cl. ........................................ 257/301; 257/296
[58] Field of Search ..................................... 257/296, 301

[56] References Cited

U.S. PATENT DOCUMENTS

| | | |
|---|---|---|
| 4,896,197 | 1/1990 | Mashiko . |
| 5,357,132 | 10/1994 | Turner . |
| 5,387,534 | 2/1995 | Prall . |
| 5,508,541 | 4/1996 | Hieda et al. . |
| 5,684,313 | 11/1997 | Kenney . |
| 5,693,971 | 12/1997 | Gonzalez . |

FOREIGN PATENT DOCUMENTS

| | | |
|---|---|---|
| 50-1379 | 1/1975 | Japan . |
| 59-977 | 1/1984 | Japan . |
| 61-31637 | 7/1986 | Japan . |
| 3-272165 | 12/1991 | Japan . |
| 5-175448 | 7/1993 | Japan . |

OTHER PUBLICATIONS

Nikkei Microdevices, Jun. 1992, pp. 84–88.
IEEE Transactions on Electron Devices, vol. 42, No. 2, Feb. 1995, pp. 295–300.

*Primary Examiner*—Stephen D. Meier
*Attorney, Agent, or Firm*—Pollock, Vande Sande & Amernick

[57] ABSTRACT

Dielectric isolation in the bit-line direction is performed by a first trench filled with an insulator, dielectric isolation in the word-line direction is performed by a second trench filled with a conductive film serving as a field-shield electrode interposing an insulating film, and capacitors are formed on side walls of the second trench by the conductive film and a semiconductor substrate with the insulating film interposed therebetween. A high-density, large-scale DRAM is realized by combining the technologies of field-shield element isolation, trench element isolation, and side-wall capacitors in a trench. In this DRAM, the conductive film in a trench-capacitor structure serves as a field-shield electrode in a field-shield structure for dielectric isolation between memory cells. Since the capacitor forms a capacitance inside the semiconductor substrate on one side wall of the trench, high-density integration is possible. This further increases the density and the scale of a semiconductor integrated circuit.

19 Claims, 7 Drawing Sheets

SEMICONDUCTOR INTEGRATED CIRCUIT AND A METHOD OF MANUFACTURING THE SAME

BACKGROUND OF THE INVENTION

1. Field of the Invention

The present invention relates to a semiconductor integrated circuit in which memory cells including transistors and capacitors (capacity elements) are formed on the major surface of a semiconductor substrate, also relates to a method of manufacturing the same.

2. Description of the Related Art

Technologies of integrating memory cells having MOS transistors and capacitors on the major surface of a semiconductor substrate are conventionally known. In this conventional semiconductor integrated circuit, to dielectrically isolate the memory cells, a LOCOS (Local Oxidation of Silicon) structure, a field-shield structure, and a trench structure are used. The LOCOS structure dielectrically isolate the memory cells by using a thick field oxide film, as disclosed in Japanese Patent Publication No. 50-1379 (Application No. 43-44309, Patent No. 789648). The field-shield structure dielectrically isolate the memory cells by fixing an electrode of a MOS structure at a reference potential and cutting off a parasitic MOS transistor, as introduced in "Nikkei Microdevices", June, 1992, pp. 84–88. The trench structure dielectrically isolate the memory cells by forming a trench in the major surface of a semiconductor substrate between element active regions in which memory cells are to be formed and filling the trench with an insulator.

These dielectric isolation technologies pose the following problems when realizing a high-density, large-scale semiconductor integrated circuit. In the LOCOS structure, if a thick field oxide film is formed to ensure sufficient dielectric isolation, an extension at the end portion of the field oxide film, what is called a "bird's beak", is formed. Additionally, since a high-concentration impurity diffuses from the lower surface of the field oxide film to the element active region, the circuit element function in the element active region is decreased by a narrow-channel effect on the influence of the diffusion. These make a high density difficult to obtain. In the field-shield structure, since the field-shield structure itself is a MOS transistor structure, down-scaling and miniaturization are limited by a short-channel effect. Especially, in a DRAM, since it is necessary to dielectrically isolate a large number of capacitors, while avoiding the formation of very small leakage current paths between them, it is difficult to decrease the dielectric isolation width. In the trench structure, since a leakage path is formed by mechanical strain near the bottom surface of the trench, the electrical characteristics of a semiconductor integrated circuit having memory cells of a DRAM on a large scale are degraded.

These conventional dielectric isolation technologies are unsatisfactory to realize a future high-density, large-scale DRAM in which memory cells having MOS transistors and capacitors are arranged in a matrix manner on one major surface of a semiconductor substrate and dielectrically isolated from each other.

SUMMARY OF THE INVENTION

It is an object of the present invention to provide a semiconductor integrated circuit in which memory cells having transistors and capacitors can be integrated in a high density on a large scale, and to a method of manufacturing the same.

According to an aspect of the present invention, there is provided a semiconductor integrated circuit in which a plurality of memory cells having transistors and capacitors are arranged in a matrix on one major surface of a semiconductor substrate comprising a trench formed in the semiconductor substrate between the memory cells adjacent to each other, and a conductive film filling the trench with an insulating film intervening, the insulating film covering inner wall of the trench; wherein the conductive film is a field-shield electrode for dielectrically isolating the memory cells adjacent to each other across the trench, capacitively coupled with the semiconductor substrate in the memory cells at side wall portions of the trench through the insulating film, and constituting the capacitors of the memory cells together with the semiconductor substrate and the insulating film.

According to another aspect of the present invention, there is preferably provided a semiconductor integrated circuit wherein the semiconductor substrate is constituted by a heavily doped silicon single-crystal substrate of one conductivity type and a lightly doped epitaxial layer of the same conductivity type formed on the silicon single-crystal substrate.

According to another aspect of the present invention, there is preferably provided the semiconductor integrated circuit further comprising conductive regions formed in portions close to the side wall portions of the trench in the epitaxial layer, and wherein the conductive regions are electrically connected to at least one of drains and sources of the transistors.

According to another aspect of the present invention, there is preferably provided the semiconductor integrated circuit wherein side wall surfaces of the trench is roughened surfaces which is formed by, e.g., crystal grains of poly crystal silicon.

According to another aspect of the present invention, there is provided a method of manufacturing a semiconductor integrated circuit in which a plurality of memory cells having transistors and capacitors are arranged in a matrix on one major surface of a semiconductor substrate comprising the first step of forming trenches for dielectrically isolating the surface of the semiconductor substrate in units of predetermined circuit functions; the second step of burying an insulator in a first trench, of the trenches, extending in a row direction; the third step of burying a conductive film in a second trench, of the trenches, extending in a column direction, the conductive film having a dielectric isolation function and also having a function of the capacitors by capacitively coupling to the semiconductor substrate; and the fourth step of forming the transistors on the semiconductor substrate in element active regions formed by dielectric isolation of the first and second trenches.

According to another aspect of the present invention, there is preferably provided the method of manufacturing a semiconductor integrated circuit wherein the semiconductor substrate is constituted by a heavily doped silicon single-crystal substrate of one conductivity type and a lightly doped epitaxial layer of the same conductivity type formed on the silicon single-crystal substrate.

According to another aspect of the present invention, there is preferably provided the method of manufacturing a semiconductor integrated circuit further comprising, after the second step and before the third step, the fifth step of forming conductive regions by thermally diffusing an impurity in side wall portions of the second trench, and wherein, in the fifth step, the conductive regions are formed to conduct to at least one of drains and sources of the transistors.

According to another aspect of the present invention, there is preferably provided the method of manufacturing a semiconductor integrated circuit further comprising: after the second step and before the third step, the sixth step an of forming conductive regions by thermally diffusing an impurity in side wall portions of the second trench, and forming poly crystal silicon grains on side wall surfaces of the second trench to roughen the side wall surfaces, and wherein, in the sixth step, the conductive regions are formed to conduct to at least one of drains or sources of the transistors.

In the semiconductor integrated circuit of the present invention, a conductive film in a trench-capacitor structure serves as a field-shield electrode in a field-shield structure for dielectric isolation between memory cells. Since a capacitor forms a capacitance inside the semiconductor substrate on one side wall of a trench, high density integration is possible. Also, since memory cells are isolated by a trench structure having a field-shield structure, the defective ratio is lower than in conventional trench structures, and the dielectric isolation width is smaller than in a LOCOS structure. Additionally, after the trench is formed, impurities are double-diffused in the side walls of the trench, and a conductive region of one conductivity type in a trench-capacitor structure is covered with a conductive region of an opposite conductivity type, thereby forming a conductive region having a two-layer structure which is a counter electrode of the conductive film (field-shield electrode). In this case, a sufficient dielectric isolation characteristic can be obtained even if the dielectric isolation width is further decreased. Additionally, the semiconductor substrate is formed by a heavily doped silicon single-crystal substrate and its upper epitaxial layer, and the bottom of the trench reaches the heavily doped silicon single-crystal substrate. In this case, since no electric charge is stored on the bottom of the trench, a very small current leakage can be prevented. That is, in the semiconductor integrated circuit of the present invention, dielectric isolation in the bit-line direction is performed by a first trench filled with an insulator, dielectric isolation in the word-line direction is performed by a second trench filled with a conductive film serving as a field-shield electrode interposing an insulating film, and capacitors are formed on side walls of the second trench by the conductive film and a semiconductor substrate with the insulating film interposed therebetween. A high-density, large-scale semiconductor integrated circuit is realized by combining the technologies of field-shield element isolation, trench element isolation, and side-wall capacitors in a trench. Additionally, in the case that the gate electrode of a transistor and the field-shield electrode are formed in the same step, the longitudinal structure of a semiconductor integrated circuit is simplified, and this prevents deterioration of the characteristics due to interlayer interference. Also, the economical efficiency is high because the manufacturing process is simplified.

As described above, in the semiconductor integrated circuit of the present invention, a conductive film in a trench-capacitor structure serves as a field-shield electrode in a field-shield structure for dielectric isolation between memory cells. Since a capacitor forms a capacitance inside the semiconductor substrate on one side wall of a trench, high-density integration is possible. This further increases the density and the scale of a semiconductor integrated circuit.

Also, in the method of fabricating a semiconductor integrated circuit of the present invention, a conductive b film in a trench-capacitor structure is formed to serve as a field-shield electrode in a field-shield structure for dielectric isolation between memory cells. Since a capacitor forms a capacitance inside the semiconductor substrate on one side wall of a trench, high-density integration is possible. Consequently, a semiconductor integrated circuit can be manufactured in a higher density on a larger scale.

DETAILED DESCRIPTION OF THE PREFERRED EMBODIMENTS

Figure 1A:
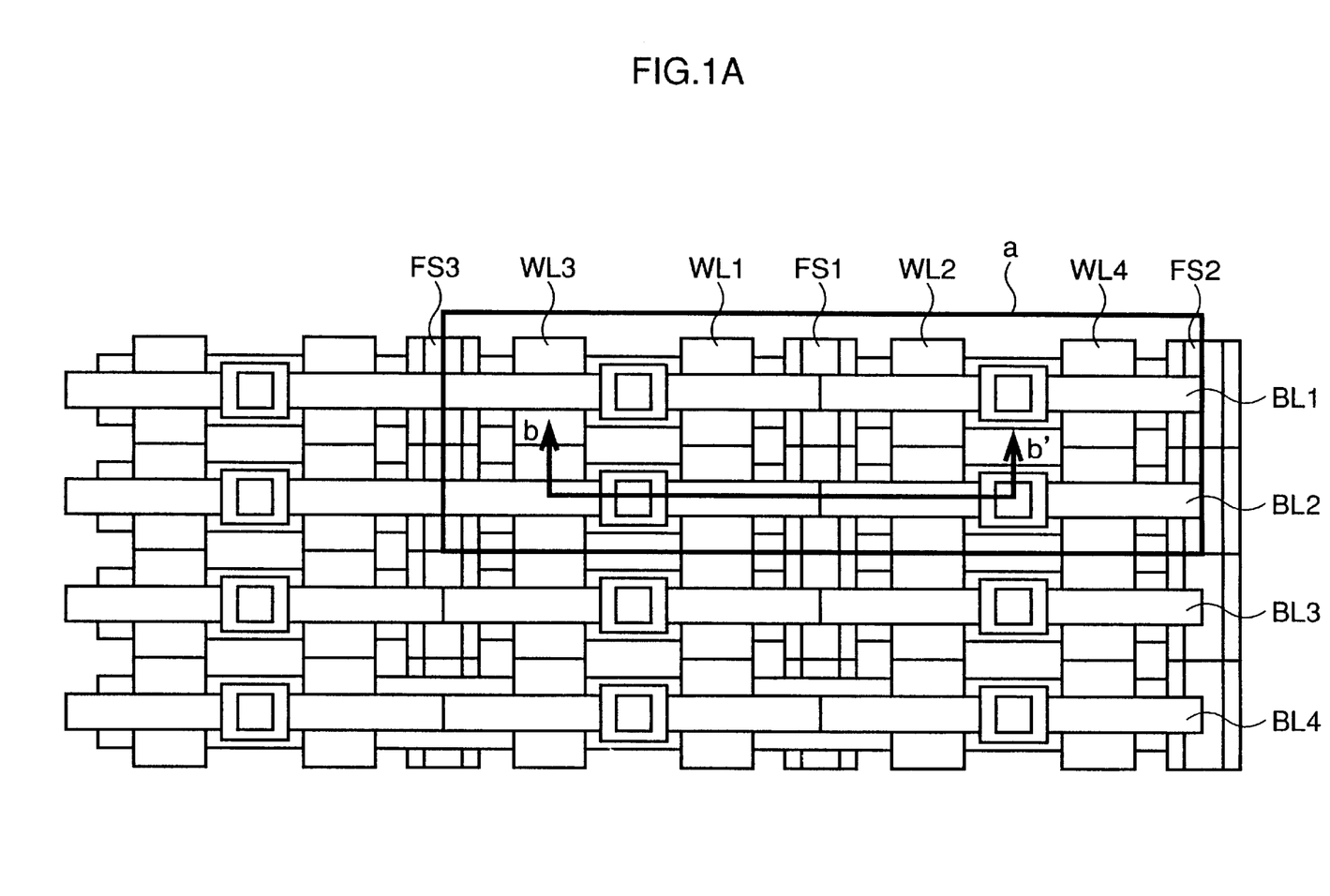
FIGS. 1A and 1B are a schematic plan view and an equivalent circuit diagram, respectively, showing the arrangement of the main components of a DRAM according to the first embodiment of the present invention.
Figure 1B:
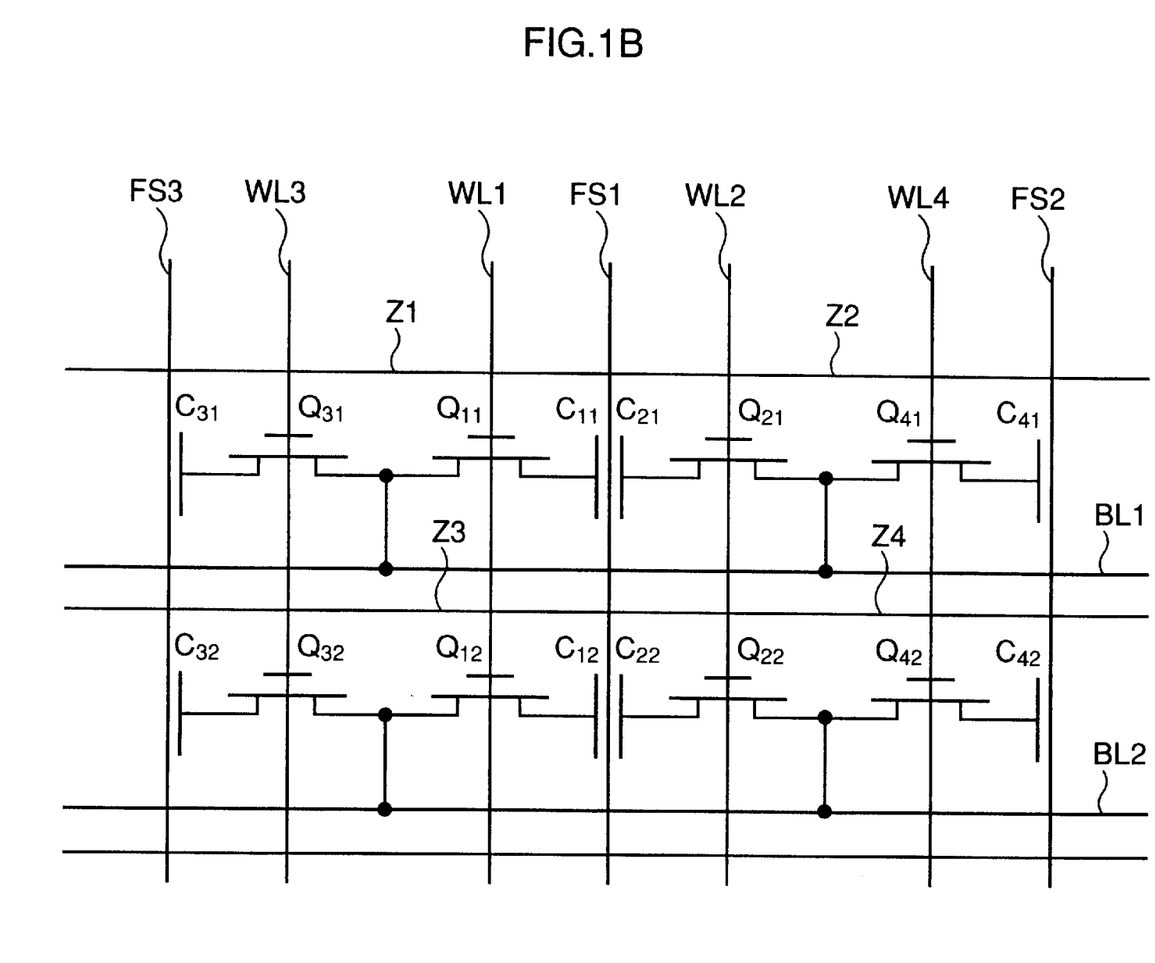

Several preferred embodiments in which the present invention is applied to a DRAM will be described in detail below with reference to the accompanying drawings.
First Embodiment FIGS. 1A and 1B are a plan view and an equivalent circuit diagram, respectively, showing the arrangement of the main components of a DRAM according to the first embodiment. As shown in FIG. 1A, the DRAM of this embodiment has bit lines (BL1, BL2, BL3, BL4, . . . ), word lines (WL1, WL2, WL3, WL4, . . . ) and memory cells. The bit lines and the word lines cross at right angles. The memory cells are positioned near the intersections of the bit lines and the word lines and constituted by MOS transistors and capacitors. In the dielectric isolation structures extending in a direction parallel to the word lines, the memory cells are dielectrically isolated from each other by field-shield structures which are formed by burying a capacitor insulating film and field-shield electrodes (FS1, FS2, FS3, . . . ) in trenches formed in a semiconductor substrate. On the other hand, in the of dielectric isolation structures extending in a direction parallel to the bit lines, the memory cells are dielectrically isolated from each other by burying an insulator in other trenches formed between the memory cells and between the field-shield structures.

FIG. 1B shows an equivalent circuit within a partial frame a in FIG. 1A. As shown in FIG. 1B, each of the field-shield electrodes in the field-shield structures extending parallel to the word lines WL1, WL2, WL3, and WL4 also serves as one electrode of a capacitor of a memory cell and is connected to a predetermined fixed potential. The other electrode of the capacitor is a conductive region formed in a side wall of a trench in the semiconductor substrate. This conductive region is connected to the source or drain of a transistor. In the DRAM of this embodiment, therefore, on the two side wall surfaces of a trench in which the field-shield electrode is buried, the capacitors of memory cells adjacent to each other in a direction parallel to the bit lines oppose each other with the field-shield electrode interposed therebetween. On the other hand, memory cells adjacent to each other in a direction parallel to the word lines are dielectrically isolated from each other by dielectric isolation zones Z1, Z2, Z3, and Z4 respectively having a trench structure in which an insulator is buried.

The structure of the memory cell in the DRAM of the first embodiment will be described below together with a method of manufacturing the DRAM in order of steps. FIGS. 2A to 2D are schematic sectional views showing the principal steps of the method of manufacturing the DRAM shown in FIGS. 1A and 1B in order of the steps. FIGS. 2A to 2D correspond to the section taken along an angurar line b–b' in FIG. 1A. The same reference numerals as in FIGS. 1A and 1B denote the same parts in FIGS. 2A to 2D. In this embodiment, a lightly doped p-type epitaxial layer 2 having a specific resistance of about 0.5 to 10 Ω cm and a thickness of about 1 to 8 μm is formed on one major surface of a heavily doped p-type silicon single-crystal substrate 1 having a specific resistance of about 0.010 to 0.050 Ω cm, thereby forming a semiconductor substrate.

Figure 2A:
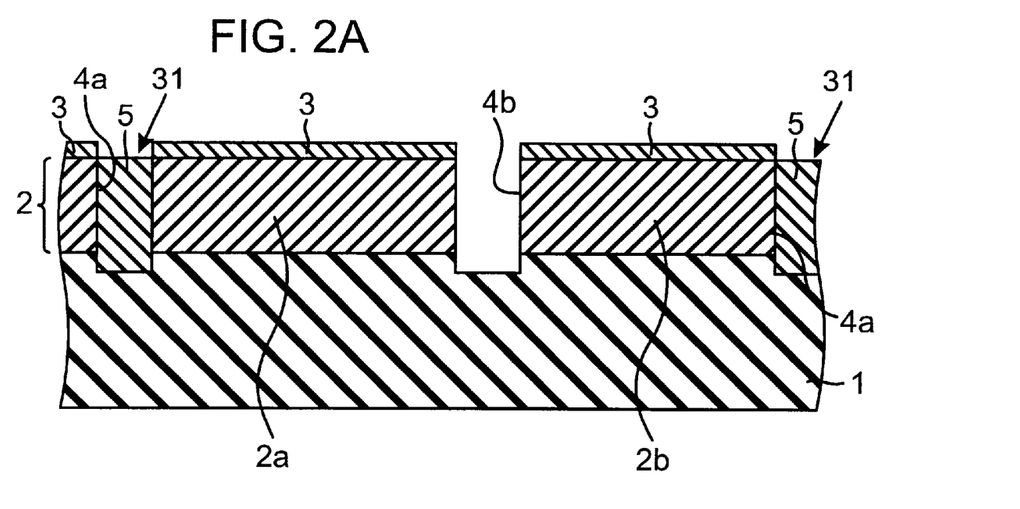
FIGS. 2A to 2E are schematic sectional views showing a method of manufacturing the DRAM according to the first embodiment of the present invention in order of steps.

First, as shown in FIG. 2A, trenches 4a and 4b are formed in the major surface of the epitaxial layer 2 by using a silicon dioxide film ($SiO_2$ film) 3 as an etching mask so as to extend longitudinally and transversely along the bit-line direction and the word-line direction and to reach the silicon single-crystal substrate 1. By this trench formation, the epitaxial layer 2 is divided in units of predetermined element active regions 2a and 2b. In the trenches 4a and 4b, after processes such as thermal oxidation, vapor phase growth, surface polishing are performed, silicon dioxide is buried as an insulator. Thereafter, the insulator is removed from the trench 4b extending in a direction parallel to word lines to be formed later so that a field-shield structure may be formed.

An insulator 5 fills the trench 4a, extending in a direction parallel to bit lines to be formed later, thereby forming trench structure 31 for dielectrically isolating memory cells adjacent to each other in a direction parallel to the word lines. In the element active regions 2a and 2b surrounded by the trenches 4a and 4b crossing each other, two-bit memory cells are formed in a later step.

Figures 2B, 2E:
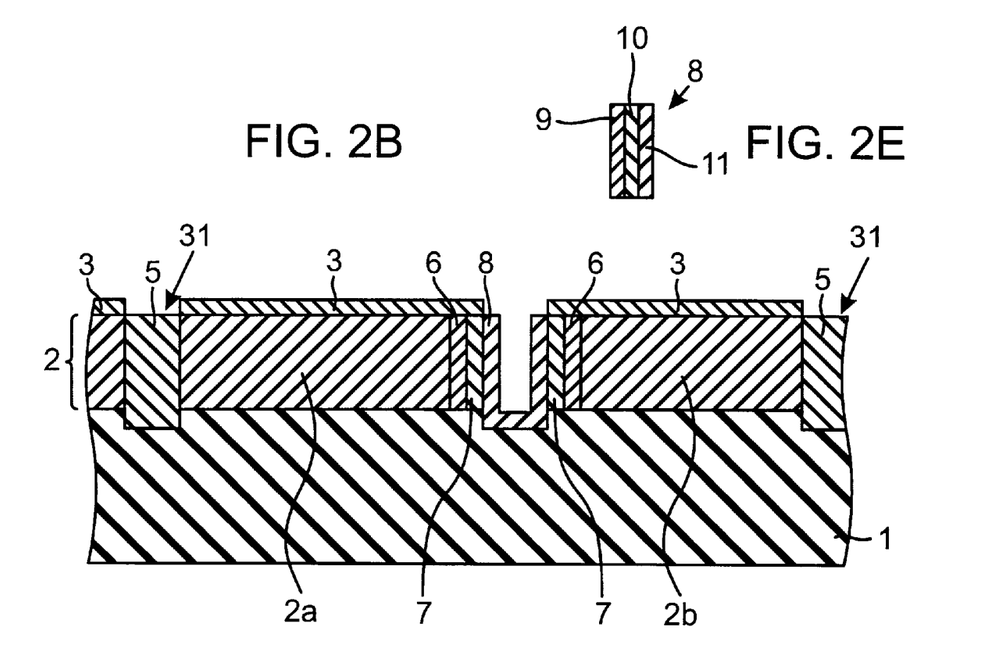

Subsequently, as shown in FIG. 2B, boron (B) at a high concentration of about $10^{17}$ to $10^{19}$ (1/cm$^3$) and phosphorus at a high concentration of about $10^{18}$ to $10^{20}$ (1/cm$^3$) are double-diffused by thermal diffusion into the epitaxial layer 2 from the side wall surfaces of the trench 4b which extends in a direction parallel to the word lines and from which the insulator is removed, thereby forming heavily doped p-type regions 6 and heavily doped n-type regions 7 as two-layer conductive regions. Thereafter, a capacitor insulating film 8 is formed on the inner wall surfaces of the trench 4b.

The p- and n-type regions 6 and 7 formed by double diffusion are diffusion regions in which a capacitor of a memory cell has a Hi-C cell structure as described in Japanese Patent Publication No. 61-31637 (Application No. 56-170618, Patent No. 1387295). Since the p- and n-type regions 6 and 7 have lower concentrations than that of the silicon single-crystal substrate 1, both regions 6 and 7 remain near the side wall surfaces of the trench 4b in the epitaxial layer 2 and are limited on the silicon single-crystal substrate 1 in which the bottom surface of the trench 4b exists. As shown in the circle in FIG. 2B, the capacitor insulating film 8 is what is called an ONO film having a three-layer structure comprising a silicon dioxide film 9, a silicon nitride film 10, and a silicon dioxide film 11. The effective film thickness of the capacitor insulating film 8, reduced as a silicon dioxide film, is set to about 30 to 100 Å.

Figure 2C:
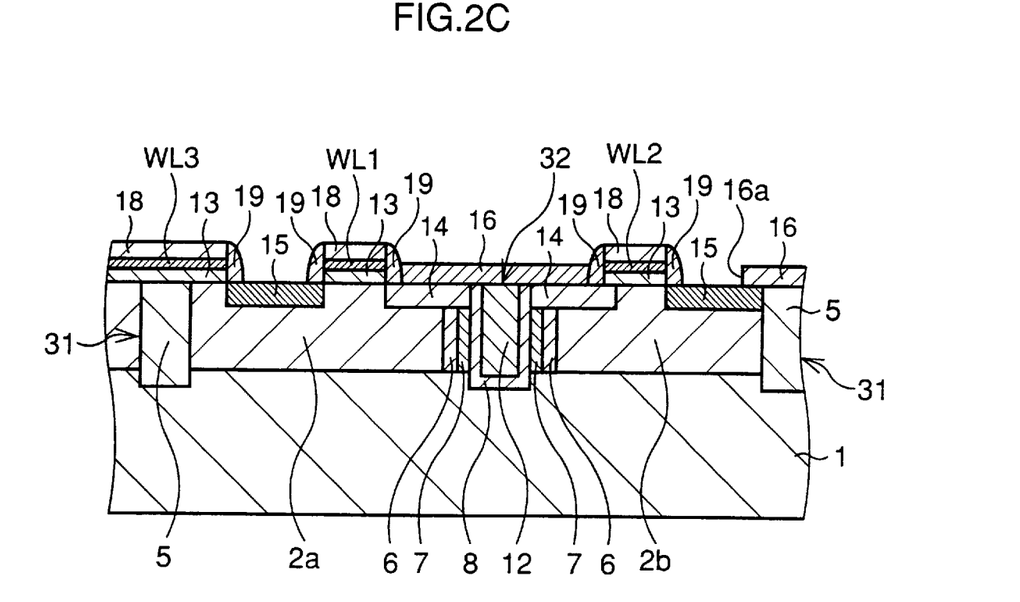

As shown in FIG. 2C, polycrystal silicon containing phosphorus (P) is buried in the trench 4b with the capacitor insulating film 8 intervening to form a field-shield electrode 12 extending in a direction parallel to the word lines, thereby forming a trench structure 32. This trench structure 32 makes a dielectric isolation zone having a field-shield structure in a direction parallel to the word lines and dielectrically isolates the element active regions 2a and 2b. The field-shield electrode 12 is connected to a fixed potential such as a predetermined power-supply potential, GND, and a substrate potential. This field-shield electrode 12 also constitutes capacitors together with the n-type regions 7 and the insulating film 8.

On the element active regions 2a and 2b, a gate insulating film 13 made of silicon dioxide and having a thickness of about 100 Å, word lines WL1, WL2, and WL3 as gate electrodes made of poly crystal silicon, and a cap insulating film 18 made of silicon dioxide are formed. Thereafter, a silicon dioxide film is deposited on the entire surface, and anisotropic dry etching is performed to form side walls 19 on the side surfaces of the word lines WL1, WL2, and WL3 and the cap insulating film 18, thereby forming gate structures of MOS transistors. The gate structure may be formed in the same step as the field-shield electrode 12 is formed. That is, when the poly crystal silicon is buried in the trench 4b with the capacitor insulating film 8 intervening to form the field-shield electrode 12, the polycrystal silicon is also deposited on the element active regions 2a and 2b and patterned to form the gate structures.

Arsenic (As) is ion-implanted into the surfaces of the element active regions 2a and 2b on both sides of the word lines WL1 and WL2 by using the gate structures as masks and thermally diffused to form n-type diffusion regions 14 and 15 having a thickness of about 0.1 μm and serving as the drains and sources of the MOS transistors. Of the n-type diffusion regions 14 and 15 of the transistors, each of the n-type diffusion regions 14 on both sides of the trench structure 32 functions as one electrode of a capacitor. In this embodiment, the n-type diffusion region 14 is connected to the n-type region 7.

An insulating film 16 is deposited on the entire surface, and contact holes 16a are formed to expose the surfaces of the n-type diffusion regions 15.

Figure 2D:
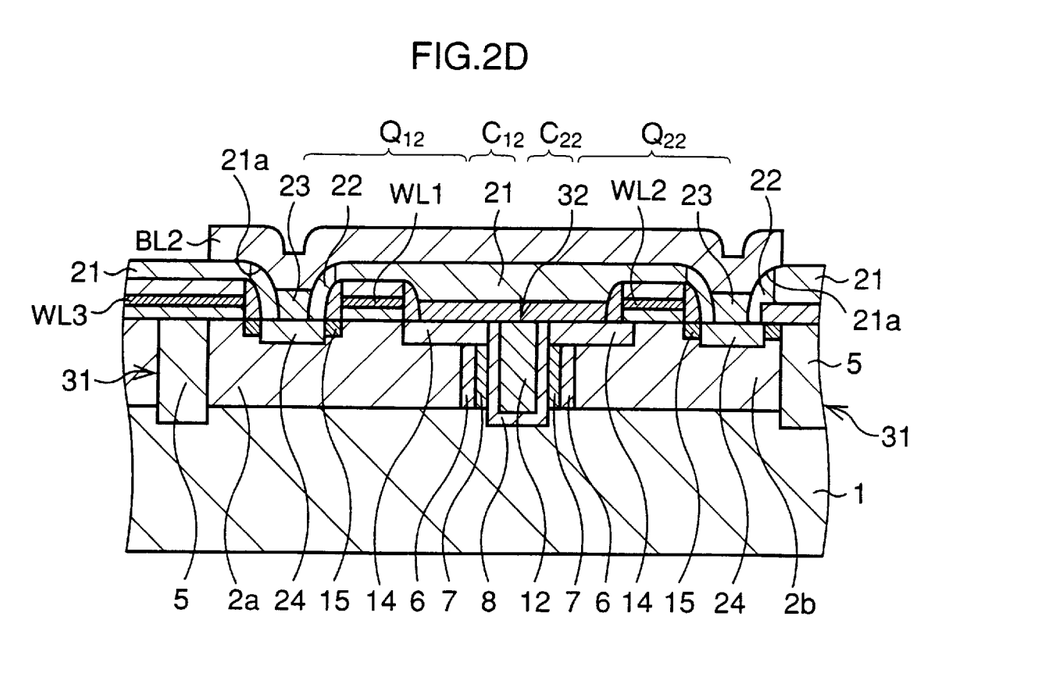

As shown in FIG. 2D, a thick insulating interlayer 21 made of boro-phospho silicate glass (BPSG) is deposited on the entire surface to cover the gate structures. Contact holes 21a are formed in the insulating interlayer 21 in substantial positions of the contact holes 16a, and a thick contact protective film 22 is formed on the side walls of the contact hole 16a.

Plugs 23 made of polycrystal silicon containing phosphorus are formed to fill the contact holes 21a. A bit line BL2 made of aluminum is formed by patterning on the insulating interlayer 21 so as to be connected to the plugs 23. In the n-type region 15, heavily doped n-type diffusion region 24 is formed by the invasion of phosphorus from the plug 23. Consequently, the heavily doped n-type diffusion regions 24 are connected to the bit line BL2 through the plugs 23, and this improves current paths between the memory cells and the bit line. In FIG. 2D, MOS transistors Q12 and Q22 and MOS capacitors C12 and C22 having a field-shield structure are the same as in FIG. 1B.

MOS transistor Q32 is formed in the element active region 2a, shares the n-type diffusion region 15 with the MOS transistor Q12, and is connected to the bit line BL2. MOS transistor Q42 is formed in the element active region 2b, shares the n-type diffusion region 15 with the MOS transistor Q22, and is connected to the bit line BL2.

In the first embodiment, a capacitor of a memory cell is formed on one side wall of the trench 4b in which the field-shield electrode 12 is buried. For example, when the width of the element active regions 2a and 2b is 0.54 μm and the depth of the trench 4b is 84 μm, it is possible to obtain a capacitor area of 4 μm², and this realizes an enough storage capacity of a memory cell in a DRAM. In the DRAM of the first embodiment, therefore, the memory cell structure is simpler and smaller than conventional memory cell structure. This improves the integration density and realizes a large scale integrated circuit.

Futhermore, in the first embodiment, the p-type epitaxial layer 2 is formed on the heavily doped p-type silicon single-crystal substrate 1, and the bottom of the trench 4b reaches the silicon single-crystal substrate 1. Accordingly, neither a charge storage layer nor a current leakage path are formed on the bottom of the trench. In this point, the trench structure in this embodiment is different from conventional trench structures. Consequently, it is possible to improve the information holding time characteristic of a DRAM cell, avoid an operation error caused by a leakage current between active regions, and prevent an increase in the standby current.

Furthermore, in the first embodiment, dielectric isolation zones extending in the direction parallel to bit lines are isolation zones formed by filling the trenches 4a with an insulator. When a design rule which avoids intersections of the field-shield electrodes 12 and the trenches 4a is used, word lines and the field-shield electrodes 12 can be formed in the same step of a poly crystal silicon process, i.e., a single-layer polysilicon process. This further simplifies the manufacturing process and improves the economical efficiency.

Though the field-shield electrodes and the word lines are made of polycrystal silicon in the first embodiment, the field-shield electrodes and the word lines can be made of tungsten silicide or a refractory metal either singly or with polycrystal silicon to have a stacked structure. In the first embodiment, the potential of the field-shield electrode 12 is fixed to a reference potential (GND) of a power supply, a substrate potential (Vbb), or an intermediate potential between a power-supply potential and GND. When the field-shield electrode 12 is fixed to a power-supply potential (Vcc), electric charge is induced in the element active regions 2a and 2b on each side wall surface of the trench 4b which oppose the field-shield electrode 12, thereby forming an inversion layer electrically coupled with the source or drain of a transistor. In this case, it is unnecessary to form, by diffusion, the n-type region 7 or both the p- and n-type regions 6 and 7 as one electrode of a capacitor, i.e., a counter electrode of the field-shield electrode 12.

Though the lightly doped epitaxial layer 2 of one conductivity type is formed on the heavily doped silicon single-crystal substrate 1 of the same conductivity type to form the semiconductor substrate in the first embodiment, the semiconductor substrate may be made of only a silicon single-crystal substrate of one conductivity type. In this case, trenches are formed in the silicon single-crystal substrate, and a heavily doped region of one conductivity type is formed on bottom of each trench to prevent the formation of a leakage path between element active regions. Thereafter, insulator isolation zones and isolation zones having a field-shield structure are formed. Consequently, a semiconductor integrated circuit similar to the DRAM of the first embodiment can be realized.

Modification

Figure 3:
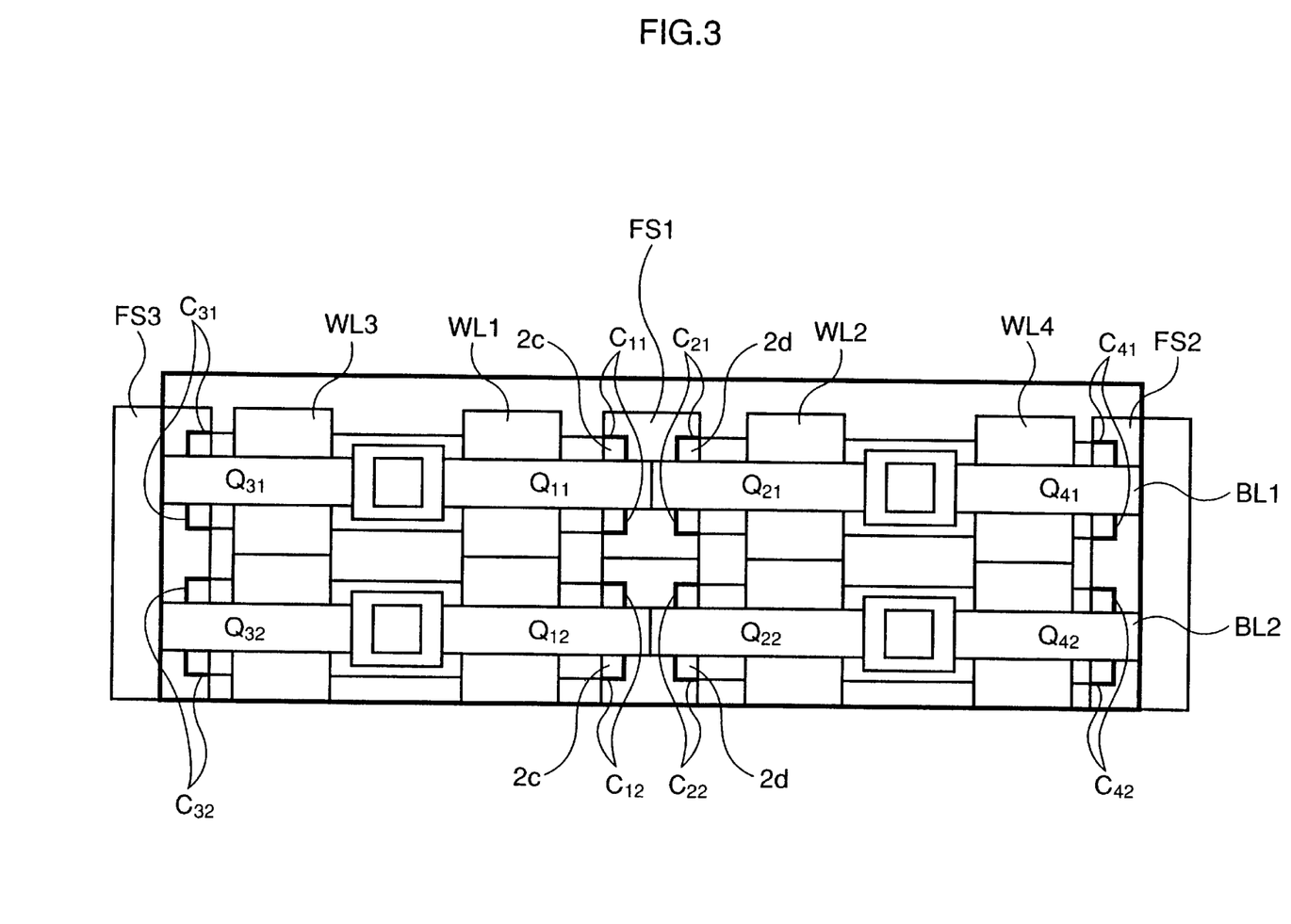
FIG. 3 is a schematic plan view showing the arrangement of the main components of a DRAM according to a modification of the first embodiment of the present invention.

A modification of the first embodiment will be described below. FIG. 3 is a plan view showing the arrangement of the main components of a DRAM according to this modification. In FIG. 3, the same reference numerals as in FIGS. 1A and 1B denote the same parts. In this modification, the width of a trench 4b having a field-shield structure is increased, and capacitor electrode portions 2c and 2d in element active regions 2a and 2b in which memory cells are so formed as to protrude from the side wall surfaces of a trench 4b by the increased width. Capacitors $C_{11}$, $C_{12}$, $C_{21}$, and $C_{22}$ are so formed that a field-shield electrode 12 covers the surfaces of the capacitor electrode portions 2c and 2d in the trench 4 with a capacitor insulating film 8 interposed therebetween and opposes the capacitor electrode portions 2c and 2d. This further increases the storage capacity.

In this modification, word lines and field-shield electrodes are formed in different steps. However, since the depth of the trench 4b can be decreased as compared to the first embodiment for the same storage capacity, the trench 4b can be easily formed.

Second Embodiment

A DRAM according to the second embodiment is manufactured to have substantially the same structure through substantially the same steps as in the first embodiment, except for the shape of side walls of a trench in which a field-shield electrode is buried. In the second embodiment, the same reference numerals as in FIGS. 1A and 1B and FIGS. 2A to 2D denote the same parts.

The arrangement of the main components of the DRAM according to the second embodiment is substantially shown by the plan view in FIG. 1A and the equivalent circuit diagram in FIG. 1B. The DRAM of this embodiment has bit lines (BL1, BL2, BL3, BL4, . . . ), word lines (WL1, WL2, WL3, WL4, . . . ) and memory cells. The bit lines and the word lines cross at right angles. The memory cells are positioned near the intersections of the bit lines and the word lines and are constituted by MOS transistors and capacitors. In the dielectric isolation structures extending in a direction parallel to the word lines, the memory cells are dielectrically isolated from each other by field-shield structures which are formed by burying a capacitor insulating film and field-shield electrodes (FS1, FS2, FS3, . . . ) in trenches formed in a semiconductor substrate. In these trenches, as will be described later, projections p, made of polycrystal silicon grainsm, are formed on the side walls of the trenches. On the other hand, in the dielectric isolation structures extending in a direction parallel to the bit lines, the memory cells are dielectrically isolated from each other by burying an insulator in other trenches formed between the memory cells and between the field-shield structures.

Each of the field-shield electrodes in the field-shield structures extending parallel to the word lines WL1, WL2, WL3, and WL4 also serves as one electrode of a capacitor of a memory cell and is connected to a predetermined fixed potential. The other electrode of the capacitor is a conductive region formed on a side wall of a trench in the semiconductor substrate. This conductive region is connected to the source or drain of a transistor. In the DRAM of this embodiment, therefore, on the two sidewall surfaces of a trench in which the field-shield electrode is buried, the capacitors of memory cells adjacent to each other in a direction parallel to the bit lines oppose each other with the field-shield electrode interposed therebetween. On the other hand, memory cells adjacent to each other in a direction parallel to the word lines are dielectrically isolated from each other by dielectric isolation zones Z1, Z2, Z3, and Z4 respectively having trench structure in which an insulator is buried.

The structure of the memory cell in the DRAM of the second embodiment will be described below together with a method of manufacturing the DRAM in order of steps.

Figure 4A:
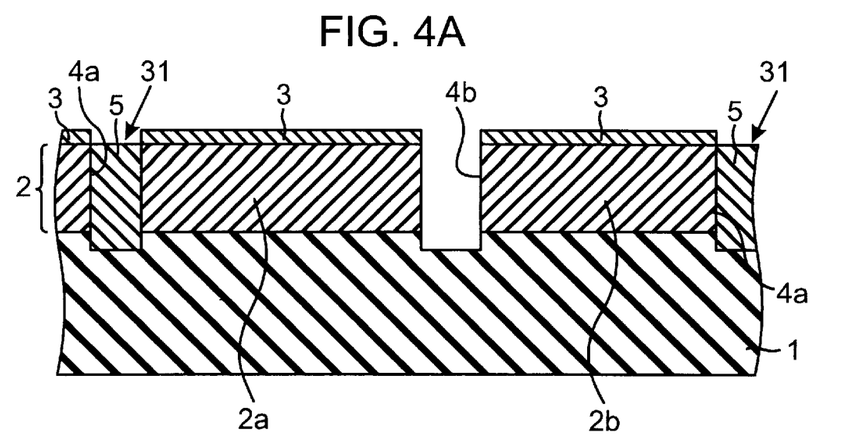
FIGS. 4A to 4F are schematic sectional views showing a method of manufacturing a DRAM according to the second embodiment of the present invention in order of steps.

First, as in the case of the first embodiment, as shown in FIG. 4A, trenches 4a and 4b are formed in the major surface of an epitaxial layer 2 by using a silicon dioxide film ($SiO_2$ film) 3 as an etching mask so as to extend longitudinally and transversely along the bit-line direction and the word-line direction and to reach a silicon single-crystal substrate 1. By this trench formation, the epitaxial layer 2 is divided in units of predetermined element active regions 2a and 2b. In the trenches 4a and 4b, after processes such as thermal oxidation, vapor phase growth, and surface polishing are performed, silicon dioxide is buried as an insulator. Thereafter, the insulator is removed from the trench 4b extending in a direction parallel to word lines to be formed later so that a field-shield structure may be formed.

An insulator 5 fills in the trench 4a extending in a direction parallel to bit lines to be formed later, thereby forming trench structure 31 for dielectrically isolating memory cells adjacent to each other in a direction parallel to the word lines. In the element active regions 2a and 2b surrounded by the trenches 4a and 4b crossing each other, two-bit memory cells are formed in a later step.

Figure 4B:
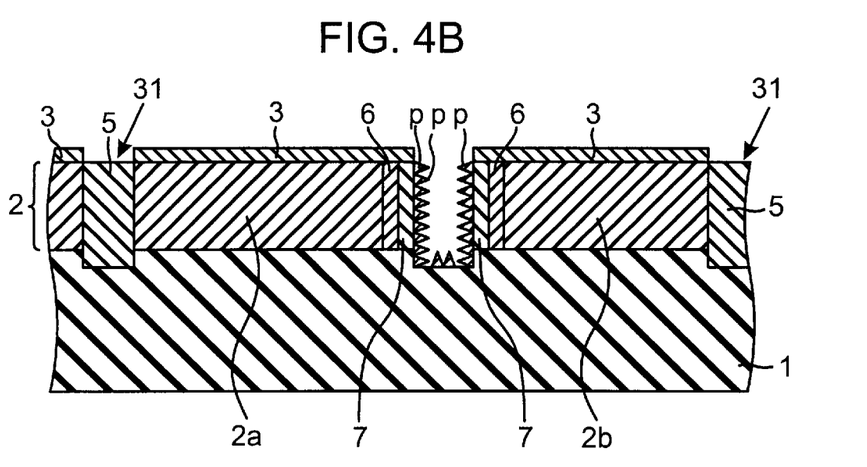
Figure 4C:
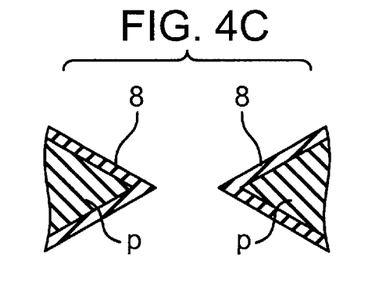

Subsequently, as shown in FIG. 4B, boron (B) at a high concentration of about $10^{17}$ to $10^{19}$ ($1/cm^3$) and phosphorus at a high concentration of about $10^{18}$ to $10^{20}$ ($1/cm^3$) are double-diffused by thermal diffusion into the epitaxial layer 2 from the side wall surfaces of the trench 4b which extends in a direction parallel to the word lines and from which the insulator is removed, thereby forming heavily doped p-type regions 6 and heavily doped n-type regions 7 as two-layer conductive regions. Thereafter, projections p made of polycrystal silicon grains are formed on the inner wall surfaces of the trench 4b by using, e.g., a technique disclosed in Japanese Patent Laid-Open No. 5-175448. A capacitor insulating film 8 is formed on the projections p in the trench 4b. FIG. 4C is an enlarged view showing the projections p in the trench 4b.

The p- and n-type regions 6 and 7 formed by double diffusion are diffusion regions in which a capacitor of a memory cell has a Hi-C cell structure as described in Japanese Patent Publication No. 61-31637 (Application No. 56-170618, Patent No. 1387295). Since the p- and n-type regions 6 and 7 have lower concentrations than that of the silicon single-crystal substrate 1, both regions 6 and 7 remain near the side wall surfaces of the trench 4b in the epitaxial layer 2 and are limited on the silicon single-crystal substrate 1 in which the bottom surface of the trench 4b exists. The projections p made of poly crystal silicon grains have n-conductivity type because the phosphorus concentration is higher than the boron concentration. Therefore, the projections p are conductively coupled with the n-type regions 7 on both sidewall surfaces of the trench 4b. As shown in FIG. 4F, the capacitor insulating film 8 is what is called an ONO film having a three-layer structure constituted by a silicon dioxide film 9, a silicon nitride film 10, and a silicon dioxide film 11. The effective film thickness of the capacitor insulating film 8 reduced as a silicon dioxide film is set to about 30 to 100 Å.

Figure 4D:
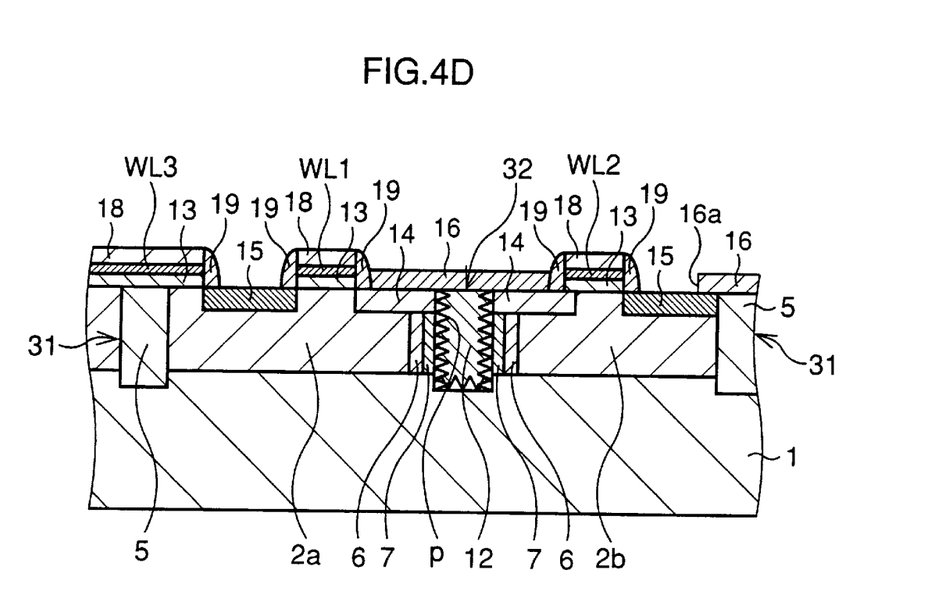

As shown in FIG. 4D, polycrystal silicon containing phosphorus (P) is buried in the trench 4b with the capacitor insulating film 8 intervening to form a field-shield electrode 12 extending in a direction parallel to the word lines, thereby forming a trench structure 32. This trench structure 32 makes a dielectric isolation zone having a field-shield structure in a direction parallel to the word lines and dielectrically isolates the element active regions 2a and 2b. The field-shield electrode 12 is connected to a fixed potential such as a predetermined power-supply potential, GND, and a substrate potential. This field-shield electrode 12 also constitutes capacitors together with the n-type regions 7 and the insulating film 8.

On the element active regions 2a and 2b, gate insulating film 13 made of silicon dioxide and having a thickness of about 100 Å, word lines WL1, WL2, and WL3 as gate electrodes made of polycrystal silicon, and a cap insulating film 18 made of silicon dioxide are formed. Thereafter, a silicon dioxide film is deposited on the entire surface, and anisotropic dry etching is performed to form side walls 19 on the side surfaces of the word lines WL1, WL2, and WL3 and the cap insulating film 18, thereby forming gate structures of MOS transistors. The gate structure may be formed in the same step as the field-shield electrode 12 is formed. That is, when the poly crystal silicon is buried in the trench 4b with the capacitor insulating film 8 intervening to form the field-shield electrode 12, the polycrystal slicon is also deposited on the element active regions 2a and 2b and patterned to form the gate structures.

Arsenic (As) is ion-implanted into the surfaces of the element active regions 2a and 2b on both sides of the word lines WL1 and WL2 by using the gate structures as masks and thermally diffused to form n-type diffusion regions 14 and 15 having a thickness of about 0.1 μm and serving as the drains and sources of the MOS transistors. Of the n-type diffusion regions 14 and 15 of the transistors, each of the n-type diffusion regions 14 on both sides of the trench structure 32 functions as one electrode of a capacitor. In this embodiment, the n-type diffusion layer 14 is connected to the n-type region 7.

An insulating film 16 is deposited on the entire surface, and contact holes 16a are formed to expose the surfaces of the n-type diffusion regions 15.

Figure 4E:
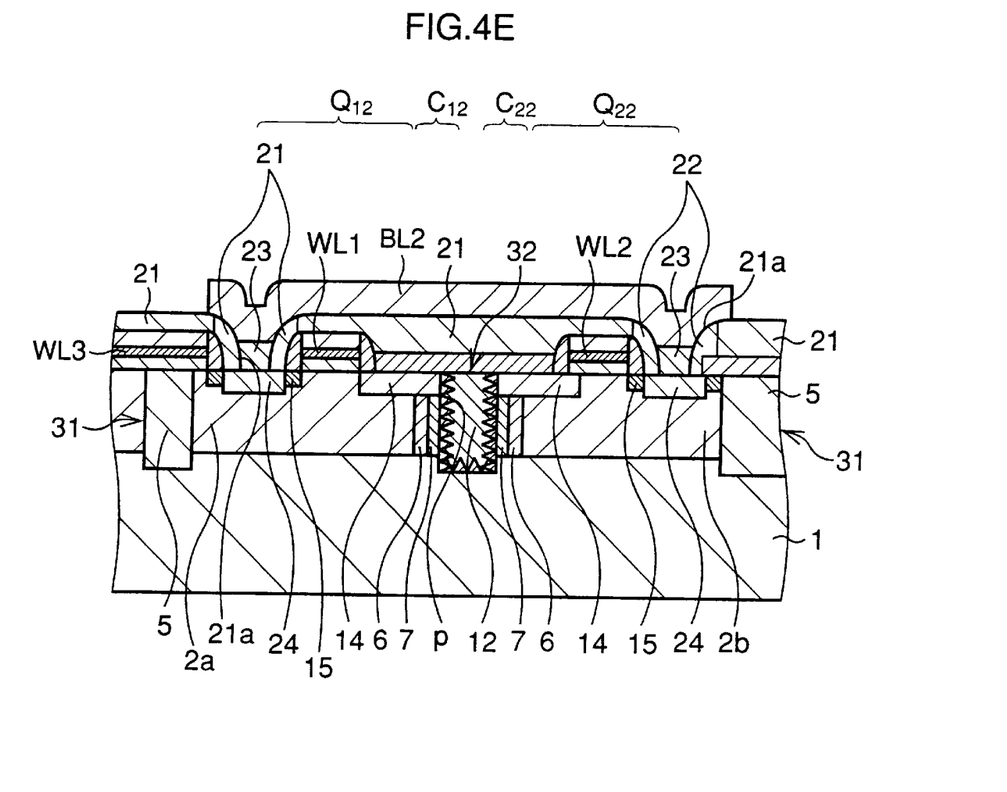
Figure 4F:
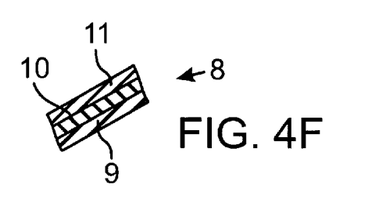

As shown in FIG. 4E, a thick insulating interlayer 21 made of boro-phospho silicate glass (BPSG) is deposited on the entire surface to cover the gate structures. Contact holes 21a are formed in the insulating interlayer 21 in substantial positions of the contact holes 16a, and a thick contact protective film 22 is formed-on the side walls of the contact hole 16a.

Plugs 23 made of polycrystal silicon containing phosphorus ares formed a to fill the contact holes 21a. A bit line BL2 made of aluminum is formed by patterning on the insulating interlayer 21 so as to be connected to the plugs 23. In the n-type region 15, heavily doped n-type diffusion region 24 is formed by the invasion of phosphorus from the plug 23. Consequently, the heavily doped n-type diffusion regions 24 are connected to the bit line BL2 through the plugs 23, and this improves current paths between the memory cells and the bit line. In FIG. 4E, MOS transistors Q12 and Q22 and MOS capacitors C12 and C22 having a field-shield structure are the same as in FIG. 1B. MOS transistor Q32 is formed in the element active region 2a, shares the n-type diffusion region 15 with the MOS transistor Q12, and is connected to the bit line BL2. MOS transistor Q42 is formed in the element active region 2b, shares the n-type diffusion region 15 with the MOS transistor Q22, and is connected to the bit line BL2.

In the second embodiment, the fine projections p are formed by what is called a HSG technique on the side wall surfaces of the trench 4b in which the field-shield electrode 12 is buried. For example, when the trench 4b between the element active regions 2a and 2b have a depth of about 7 μm, it is possible to obtain a capacitor area of about 14 $μm^2$ or more which is two to three times larger than usual areas, and this realizes a more than enough storage capacity of a memory cell in a DRAM in addition to the various effects described in the first embodiment. In the DRAM of the second embodiment, therefore, the cell dimensions are decreased by the structure and the manufacturing method that are simpler than those of conventional memory cells. This improves the integration density and realizes a large scale integrated circuit. Furthermore, since the capacity of a capacitor increases, a DRAM capable of stable electrical operation is realized.

The embodiments of the present invention have been described above. In the present invention, however, the materials and the conductivity types can be changed where necessary in the individual steps, and the order of steps can be changed in the manufacturing process. For example, element isolation zones having a field-shield structure can be formed before the formation of insulator isolation zones. Therefore, the present invention is not limited to the above embodiments and applicable to various forms of semiconductor integrated circuits.

What is claimed is:

1. A semiconductor integrated circuit in which a plurality of memory cells having transistors and capacitors are arranged in a matrix manner on one major surface of a semiconductor substrate, comprising:
    a trench formed in said semiconductor substrate between said memory cells adjacent to each other; and
    a conductive film filling said trench with an insulating film intervening, the insulating film covering inner wall of said trench,
    wherein said conductive film is a field-shield electrode for dielectrically isolating said memory cells adjacent to each other across said trench, capacitively coupled with said semiconductor substrate in said memory cells at side-wall portions of said trench through said insulating film, and constituting said capacitors of said memory cells together with said semiconductor substrate and said insulating film.

2. A circuit according to claim 1, wherein said semiconductor substrate is constituted by a heavily doped silicon single-crystal substrate of one conductivity type and a lightly doped epitaxial layer of the same conductivity type formed on said silicon single-crystal substrate.

3. A circuit according to claim 2, wherein said trench has a depth to reach said silicon single-crystal substrate through said epitaxial layer.

4. A circuit according to claim 1, wherein
    said memory cells are formed in intersections of bit lines extending in a row direction and word lines extending in a column direction and constitute a memory cell array, and
    said trenches extend substantially parallel to said word lines, and said memory cells between said trenches are dielectrically isolated by other trenches extending substantially parallel to said bit lines and filled with an insulator.

5. A circuit according to claim 1, wherein a potential of said field-shield electrode is a potential of an external power-supply.

6. A circuit according to claim 1, wherein a potential of said field-shield electrode is a reference potential of an external power-supply.

7. A circuit according to claim 2, wherein a potential of said field-shield electrode is a potential of said silicon single-crystal substrate.

8. A circuit according to claim 2 further comprising,
    conductive regions formed in said side-wall portions of said trench in said epitaxial layer, and
    wherein said conductive regions are electrically connected to at least one of drains and sources of said transistors.

9. A circuit according to claim 8, wherein said conductive region is two-layer structure constituted by diffusion regions having different conductivity types.

10. A circuit according to claim 1, wherein side-wall surfaces of said trench are roughened surfaces.

11. A circuit according to claim 10, wherein said roughened surfaces are is formed by crystal grains of poly crystal silicon.

12. A circuit according to claim 10, wherein said semiconductor substrate is constituted by a heavily doped silicon single-crystal substrate of one conductivity type and a lightly doped epitaxial layer of the same conductivity type formed on said silicon single-crystal substrate.

13. A circuit according to claim 12, wherein said trench has a depth to reach said silicon single-crystal substrate through said epitaxial layer.

14. A circuit according to claim 10, wherein
    said memory cells are formed at intersections of bit lines extending in a row direction and word lines extending in a column direction and constitute a memory cell array, and
    said trenches extend substantially parallel to said word lines, and said memory cells between said trenches are dielectrically isolated by other trenches extending substantially parallel to said bit lines and filled with an insulator.

15. A circuit according to claim 10, wherein a potential of said field-shield electrode is a potential of an external power-supply.

16. A circuit according to claim 10, wherein a potential of said field-shield electrode is a reference potential of an external power-supply.

17. A circuit according to claim 12, wherein a potential of said field-shield electrode is a potential of said silicon single-crystal substrate.

18. A circuit according to claim 12 further comprising,
    conductive regions formed in portions close to said side-wall portions of said trench in said epitaxial layer, and
    wherein said conductive regions are electrically connected to at least one of drains and sources of said transistors.

19. A circuit according to claim 18, wherein said conductive region is two-layer structure constituted by diffusion regions having different conductivity types.

* * * * *

UNITED STATES PATENT AND TRADEMARK OFFICE
CERTIFICATE OF CORRECTION

PATENT NO.   : 5,998,822
DATED        : December 7, 1999
INVENTOR(S)  : Toshio Wada It is certified that error appears in the above-identified patent and that said Letters Patent is hereby corrected as shown below:

Column 2,
Line 39, there should be a colon after "comprising".

Column 3,
Line 33, a new paragraph should begin after "substrate".
Line 65, "b" should be deleted after "conductive".

Column 10,
Line 42, "ares" should be -- are --

Column 12,
Line 19, "are is" should be -- are --

Signed and Sealed this

Tenth Day of June, 2003

JAMES E. ROGAN
*Director of the United States Patent and Trademark Office*